(12) United States Patent
Reeder et al.

(10) Patent No.: US 7,480,525 B2
(45) Date of Patent: Jan. 20, 2009

(54) POSITIVE CONTRAST MRI USING POSITIVE AND NEGATIVE FIELD INHOMOGENEITY

(75) Inventors: Scott B. Reeder, Middleton, WI (US); Garry E. Gold, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 141 days.

(21) Appl. No.: 11/381,043

(22) Filed: May 1, 2006

(65) Prior Publication Data

US 2007/0255131 A1    Nov. 1, 2007

(51) Int. Cl.
    A61B 5/055    (2006.01)
(52) U.S. Cl. .................. 600/410; 600/419; 600/420; 324/306; 324/307; 324/309
(58) Field of Classification Search ................ 600/410, 600/420, 419; 324/306, 307, 309
    See application file for complete search history.

(56) References Cited

U.S. PATENT DOCUMENTS

| 6,788,062 B2 * | 9/2004 | Schweikard et al. ........ 324/321 |
| 2005/0136002 A1 * | 6/2005 | Fossheim et al. ........... 424/1.11 |
| 2005/0261575 A1 | 11/2005 | Conolly et al. |

OTHER PUBLICATIONS

Reeder et al., "Off-Resonance Separation for Positive Contrast Imaging of Iron-Oxide Labeled Cells", Proceedings of the ISMRM 14th Scientific Meeting & Exhibition Seattle, Washington, USE May 6-12, 2006.
Cunningham et al., "Positive Contrast Magnetic Resonance Imaging of Cells Labeled with Magnetic Nanoparticles", Magnetic Resonance in Medicine 53:999-1005 (2005).

* cited by examiner

Primary Examiner—Ruth S Smith
Assistant Examiner—Jonathan G Cwern
(74) Attorney, Agent, or Firm—Beyer Law Group LLP

(57) ABSTRACT

The acquisition of multiple images at slightly different time shifts from the spin echo (or from TE=0 for gradient echo sequences), allows the separation of on-resonance spins from off-resonance spins by encoding this information in the received signal. The excitation pulse can be a standard broadband excitation that will excite all spins. The separation of on- and off-resonance spins is then performed on the received signal. The polar and equatorial lobes of a magnetic particle such as SPIO produce signals from excited water molecules near the particle which are frequency offset above and below the frequency of signals from water molecules unaffected by the particle.

19 Claims, 4 Drawing Sheets

//]: #

POSITIVE CONTRAST MRI USING POSITIVE AND NEGATIVE FIELD INHOMOGENEITY

BACKGROUND OF THE INVENTION

This invention relates generally to magnetic resonance imaging (MRI), and more particularly the invention relates to the use of MRI in tracking magnetically labeled cells or objects in the presence of magnetic field inhomogeneity using positive contrast.

Magnetic resonance imaging (MRI) requires placing an object to be imaged in a static magnetic field, exciting nuclear spins in the object within the magnetic field, and then detecting signals emitted by the excited spins as they process within the magnetic field. Through the use of magnetic gradient and phase encoding of the excited magnetization, detected signals can be spatially localized in three dimensions.

Contrast agents incorporating super-paramagnetic iron-oxide (SPIO) nanoparticles have shown much promise as a means to visualize labeled cells using MRI. The small size of the particles (<100 nm) facilitates transport across cell membranes, and the low toxicity allows for large iron loads without significant cell death (e.g., 25 pg/cell). Labeling can be performed by incubating cells of interest (e.g., embryonic stem cells) with the contrast agent in vitro, as well as a transfection agent, so that they can be monitored in vivo using MRI. Cells such as macrophages can be labeled in vivo by introducing the contrast agent into the bloodstream, with the uptake of the agent occurring by phagocytosis, which has been used to image atherosclerosis and other inflammatory processes. In more advanced schemes, SPIO-protein complexes that bind to the receptors on specific cells have been used.

Imaging in the presence of severe magnetic field inhomogeneities has been very challenging for magnetic resonance imaging applications. The ability to image directly adjacent to metallic implants for example, has been very limited due to image distortion and markedly shortened T2*. In addition, detection of super-paramagnetic iron oxide particles (SPIO) or similar paramagnetic particles has gained tremendous interest for molecular imaging applications. Specific applications include detecting of antibodies tagged with SPIO's or stem cells labeled with SPIO particles. The ability to detect these targeted contrast agents with high sensitivity and specificity would have enormous impact in the areas of molecular imaging, which target in vivo cellular and molecular processes for detection and assessment of important diseases such as cancer, cardiovascular diseases, Alzheimer's disease, to name a few. The ability to detect and track stem cells is critical in the evaluation of new stem cell therapies currently being developed for numerous applications in the body including diabetes, Parkinson's disease, Alzheimer's disease, spinal cord injury, myocardial cell regeneration, to name a few.

Detection of SPIO and other highly paramagnetic particles has relied primarily on signal decay mechanisms, ie: T2* decay. Although effective, this method is relatively insensitive and non-specific. Thus, the conspicuity of collections of these particles visualized with T2* sensitive pulse sequences is limited by the fact that signal is dark in a background of bright signal in the remainder of the image.

A new approach to SPIO detection has been recently described by Cunningham et al (See Cunningham et al, MRM 2005, 53:999-1005 and copending application Ser. No. 10/849,068, filed May 18, 2004). This method exploits the off-resonance environment created by these particles. It does so by using specially designed RF pulses that transmit RF power with relatively narrow bandwidths centered near at a dominant off-resonance frequency created by the SPIO. In this way, only spins in the direct vicinity of the SPIO particles are excited, while the remainder of the image where there are no particles, remains dark. This creates "positive contrast" and creates images with very high conspicuity bright regions that correspond to the location of the SPIO particles.

SUMMARY OF INVENTION

The present invention utilizes positive contrast in imaging localized magnetic inhomogeneity. However, unlike the prior art which utilizes a spectrally-selective pulse to excite and refocus off-resonance spins adjacent to iron labeled cells, the invention utilizes a spectroscopic approach whereby multiple images are acquired at different time shifts, thereby utilizing positive and/or negative off-resonance from positive polar lobes and negative equatorial lobes of magnetic field perturbations surrounding a paramagnetic particle or other perturbation of the magnetic field.

In one embodiment, an on-resonance and two off-resonance signals are selected including a negative frequency offset signal due to negative equatorial lobes and a positive frequency offset due to the positive polar lobes. The off-resonance signals can be summed to identify the magnetic susceptibility labeled regions, The on-resonance signal provides accurate registration with anatomic images.

The invention and object and features thereof will be more readily apparent from the following detailed description and appended claims when taken with the drawings.

DETAILED DESCRIPTION OF ILLUSTRATIVE EMBODIMENTS

Figure 1:
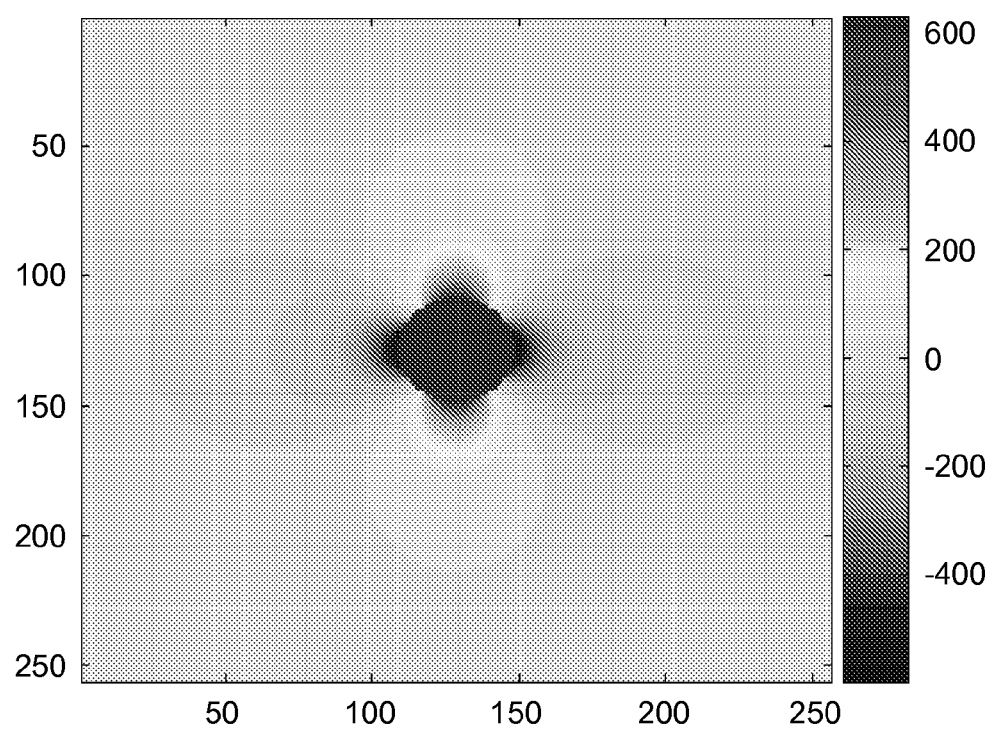
FIG. 1 illustrates field inhomogeneity (Hz) in the vicinity of a cylinder placed perpendicular to the main magnetic field. Note the symmetry with areas of positive and negative field inhomogeneity. Excluding for the field within the cylinder, the integral of the field outside of the cylinder is zero. Also note that for a metallic object, the signal generated from the interior of the cylinder is also zero.

In accordance with the invention, the acquisition of multiple images at slightly different time echo time shifts, will allow the separation of on-resonance spins from off-resonance spins by encoding this information in the received signal. The excitation pulse can be a standard broadband excitation that will excite all spins. The separation of on- and off-resonance spins is then performed on the received signal.

Consider now the theory underlying the invention. Assume the presence of two or more species, at least one of which is on-resonance. One of the off-resonance species could be fat, in which case a fat image is obtainable along with a on-resonance image and a SPIO image, for example. The signal detected in a voxel containing these spins is $$s(t_n) = \rho_o + \sum_{m=1}^{M} \rho_m e^{i2\pi \Delta f_m t_n} \quad (1)$$

where $p_0$ is the on-resonance component, and $p_m$ is the $m^{th}$ off-resonance component, m=1, . . . ,M. $\Delta f_m$ is the off-resonance frequency of the $m^{th}$ component, and $t_n$ (n=1, . . . ,N) is the echo time at which $s(t_n)$ was acquired. Equation one forms a simple set of linear complex equations, which can be written in matrix format, $$S = Ap \quad (2)$$

where S is the signal vector $S=[s(t_1) s(t_2) \ldots s(t_n)]$, and p is the "species" vector, $p=[p_0\ p_1\ \ldots\ p_M]^T$ and A is the coefficient matrix, $$A = \begin{bmatrix} 1 & e^{i2\pi \Delta f_1 t_1} & e^{i2\pi \Delta f_2 t_1} & \ldots & e^{i2\pi \Delta f_M t_1} \\ 1 & e^{i2\pi \Delta f_1 t_2} & e^{i2\pi \Delta f_2 t_2} & \ldots & e^{i2\pi \Delta f_M t_2} \\ \ldots & \ldots & \ldots & \ldots & \ldots \\ 1 & e^{i2\pi \Delta f_1 t_N} & e^{i2\pi \Delta f_2 t_N} & \ldots & e^{i2\pi \Delta f_M t_N} \end{bmatrix} \quad (3)$$

noting that all elements of matrix A are known. Estimates of the on- and off-resonance components ($p_0$ and $p_1$) are then determined from the pseudo-inverse of equation 2, ie:

$$\hat{p} = (A^H A)^{-1} A^H S \quad (4)$$

providing estimates of the on- and off-resonance components of the signal in that voxel. It is very important to note that the estimates of on- and off-resonance components can be reconstructed with different presumed off-resonance frequencies ($\Delta f_m$). In this way, multiple components may be determined from processing the same data with multiple different presumed frequency shifts.

For simplicity, consider only one off-resonance component, ie: M=1.The mathematics are only minimally more complex for multiple species.

$$s(t_n) = p_0 + p_1 e^{i2\pi \Delta f t_n} \quad (5)$$

and the A matrix becomes, $$A = \begin{bmatrix} 1 & e^{i2\pi \Delta f t_1} \\ 1 & e^{i2\pi \Delta f t_1} \\ \ldots & \ldots \\ 1 & e^{i2\pi \Delta f t_n} \end{bmatrix} \quad (6)$$

A particularly useful combination occurs using symmetric frequency shifts, in the situation with a magnetic dipole which has both positive and negative components in the same (see below).

Magnetic Dipoles

The magnetic field disturbance for an infinite cylinder of radius R placed in a magnetic field B0 at an angle α to the main magnetic field is, $$\Delta B_z(r, \theta) = \begin{cases} B_O \frac{\Delta \chi}{2}(1 + \cos^2 \alpha), & r < R \\ B_O \frac{\Delta \chi}{2}\left(\frac{R}{r}\right)^2 \cos 2\theta \sin^2 \alpha, & r > R \end{cases} \quad (7)$$

where $\Delta_\chi$ is the susceptibility difference between the cylinder and the surrounding media, and the off-resonance frequency is given by the Larmor relation, ie:

$$\Delta f = \frac{\gamma}{2\pi} \Delta B_z.$$

The field distortion is maximized when α=π/2. For aluminum and water, the bulk susceptibility difference is approximately $2 \times 10^{-5}$ ppm, such that the maximum frequency shift that could be expected at 1.5 T is approximately 630 Hz. Equation 7 is plotted in FIG. 1 for this set of parameters. It is important to note that the maximum magnetic field is not dependent on the radius of the particle, only the field strength ($B_0$), the angle with respect to the main magnetic field (α), and most importantly the susceptibility difference $\Delta_\chi$.

As similar relationship occurs for a sphere located within a magnetic field, specifically, $$\Delta B_z(r, \theta) = \begin{cases} B_O \frac{2\Delta \chi}{3}, & r < R \\ B_O \frac{\Delta \chi}{3}\left(\frac{R}{r}\right)^3 (3\cos^2 \theta - 1), & r > R \end{cases} \quad (7)$$

Three Component Model

Noting that the spins outside a cylinder have "symmetric" areas of positive and negative off-resonance, a useful way to model the signal is with three components, one on-resonance and the other two, equal but opposite frequency shifts, ie:

$$s(t_n) = p_0 + p_+ e^{i2\pi \Delta f t_n} + p_- e^{-i2\pi \Delta f t_n} \quad (8)$$

and the A matrix becomes, $$A = \begin{bmatrix} 1 & e^{i2\pi \Delta f t_1} & e^{-i2\pi \Delta f t_1} \\ 1 & e^{i2\pi \Delta f t_2} & e^{-i2\pi \Delta f t_2} \\ \ldots & \ldots & \ldots \\ 1 & e^{i2\pi \Delta f t_N} & e^{-i2\pi \Delta f t_N} \end{bmatrix} \quad (9)$$

Figure 2:
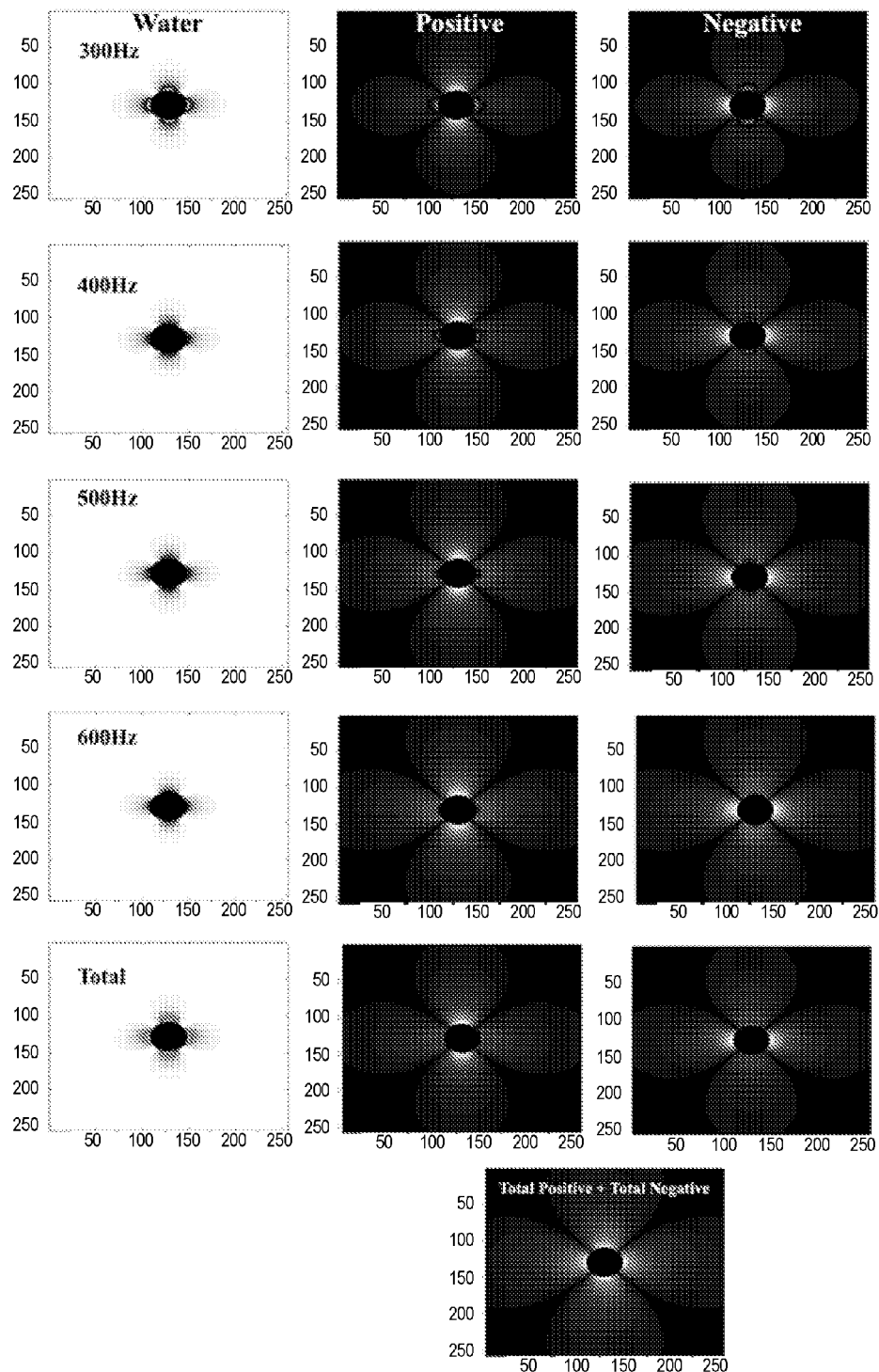
FIG. 2 illustrates separated water (left column) images, positive frequency offset components (middle column) and negative frequency offset components (right column) reconstructed using presumed resonance offsets of 300 Hz, 400 Hz, 500 Hz and 600 Hz. In addition the sum of these frequency component images are also shown ("Total" row) and also the sum of the total positive and negative frequency components. All images are displayed as magnitude images.

Simulations were performed using the three-point model (equations 8 and 9) for a cylinder with susceptibility difference of $2 \times 10^{-5}$ ppm between the surrounding spins which are assumed to have a uniform spin-density of one. The reconstruction was performed for the following resonant offsets: 400 Hz, 500 Hz, 600 Hz, and the results are plotted in FIG. 2, where the water, positive frequency offset component, and negative frequency components for different presumed frequency offsets. In addition, the sum of these images is also shown, as well as the sum of the total positive and negative frequency components.

These simulations demonstrate the ability of this method to separate on-resonance from off-resonance spins. In this way, spins in the vicinity of areas of high susceptibility (e.g. adjacent to a SPIO particle) can be superimposed back onto the on-resonance image, perhaps with color-coding or other means to indicate a focus of high local susceptibility.

Figure 3:
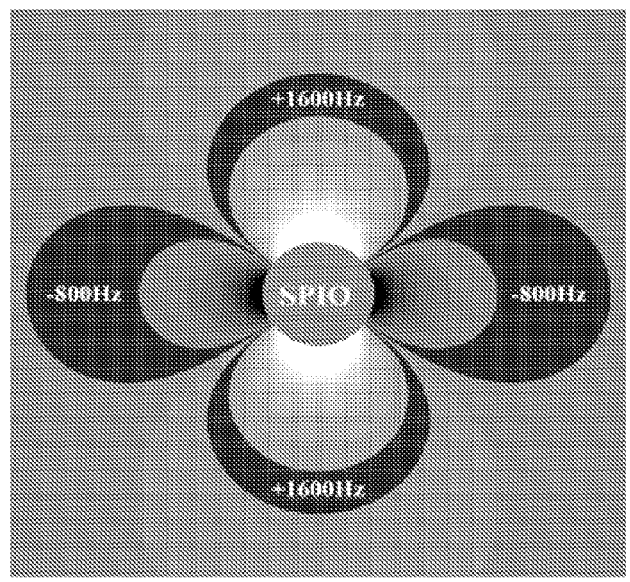
FIG. 3 is a schematic of the B0 field surrounding an iron oxide sphere. Polar lobes are positive with equatorial lobes are negative and half the magnitude of the polar lobes.

As shown in FIG. 3 the magnetic field perturbation surrounding an iron oxide sphere has two polar lobes ($\theta=0, 180°$ relative to the $B_0$ field) which are symmetrical and positive, while the equatorial lobes ($\theta=90°, 270°$) have similar perturbations that are symmetrical, negative and half the magnitude of the polar field perturbations. For this reason, a spherical geometry lends well to a two off-resonance component system (M=2) with $\Delta f2=-\Delta f1/2$. In the work by Cunningham et al, it was found empirically that frequency offsets of $-800$ Hz, corresponding to the equatorial lobes of the field perturbation, gave optimal positive contrast. Thus, we chose M=2, and $\Delta f1=1600$ Hz and $\Delta f2=-800$ Hz.

Figure 4:
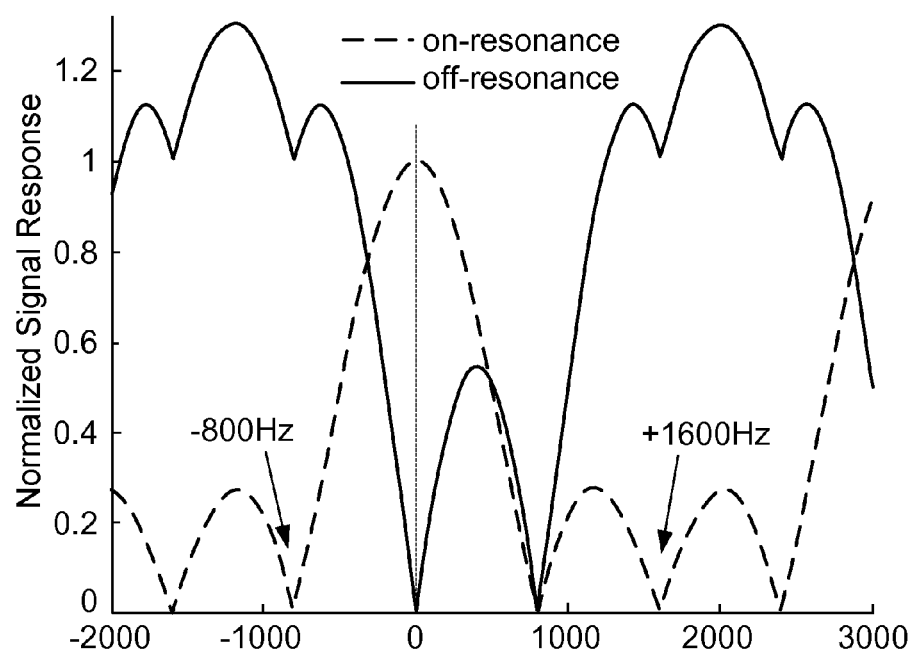
FIG. 4 illustrates frequency response of separation method for $\Delta f_1 = 1600$ Hz and $\Delta f_2 = -800$ HZ (M=2) and 4 echoes separated by 300 µs.

The frequency response of this model was calculated and plotted in FIG. 4. The on-resonance signal and the sum of the two off-resonance components (abs(p1)+abs(p2)) are plotted for a range of "test" frequencies, acquired using four echoes spaced by 300 us. Note the wide pass bands near $-800$ Hz and 1600 Hz.

Materials and Methods: Mouse skeletal myoblasts (C2C12; ATCC) were incubated with a mixture of SPIOs (100 ug/ml; Feridex; Berlex Laboratories) and protamine sulfate (2 ug/ml; American Pharmaceuticals Partner) in serum-free RPMI 1640 medium for 3 hrs, followed by 24 hrs of incubation in supplemented DMEM medium (Gibco, 10% FBS, 1% P/S). Afterwards, cells were harvested by trypsinization, washed three times with PBS, and resuspended in PCR tubes at different cell concentrations (0.5–2.5×10$^6$ cells/350 µl PBS). Tubes were embedded in 1% agar containing 0.5% copper sulfate.

Imaging was performed on a 1.5 T GE TwinSpeed 11.0 MR scanner (Waukesha, Wis.) using a product extremity coil. Proton density weighted FSE images were obtained with a modified FSE sequence capable of shifting echo with respect to the spin echo, creating relative phase shifts from off-resonance effects. Echo shifts were 0.0, 0.3, 0.6, 0.9 ms. TR/TEeff=2000/14.8 ms, BW=±20 kHz, 256×256 matrix size, FOV=10 cm, slice=5 mm, scan time=2:08 min. Complex source images were processed with software written in Matlab (Mathworks, Natick, Mass.) that uses Eq. 3 to separate on- from off-resonance signal.

Figure 5:
FIG. 5 illustrates separated A) on-resonance and B) off-resonance images SPIO labeled myoblasts. Excellent separation of the signal from the labeled cells provides positive contrast with high conspicuity. C) images can be recombined (off-resonance signal), providing anatomical references for the off-resonance signal.

Results: FIG. 5 demonstrates the separation of on- and off-resonance signal from SPIO labeled cells in axial images acquired through tubes containing 0.5×10$^6$ cells/350 µl PBS. Although any presumed frequency shift can be used with this method, it was found empirically that $\Delta f1=1600$ Hz, and $\Delta f2=-800$ Hz gave the best separation, in agreement with Cunningham's empirical finding that an excitation frequency of $-800$ Hz gave optimal positive contrast. Recombination of the two images provides anatomical reference for the off-resonance signal. A small shift in the readout direction was necessary to correct for susceptibility induced shift.

The invention provides a new method for positive contrast imaging by separating signal from spins in regions of local off-resonance. This method encodes the off-resonance signal in complex images acquired at different echo times. Although this method requires a longer scan time to acquire multiple images, it has several important advantages over excitation methods. First, the reconstruction can retrospectively select different off-resonance frequencies, while excitation methods will fail if the wrong excitation frequency is chosen. Second, the separation approach provides an on-resonance image that acts as an anatomical reference as shown in FIG. 5 in a manner similar to hybrid imaging modalities such as PET-CT. Future work will address scan time reduction methods, characterization of the optimal echo spacing for SNR optimization, and sensitivity limits of this method.

While the invention has been described with reference to specific embodiments, the description is illustrative of the invention and is not to be construed as limiting the invention. Various modifications and applications may occur to those skilled in the art without departing from the spirit and scope of the invention as defined by the appended claims.

The invention claimed is:

1. A MRI method for identifying the presence and location in a body of a contrast agent or an object with magnetic susceptibility sufficient to induce magnetic field inhomogeneity in spins near the agent or object comprising the steps of:
   a) placing the body in a static magnetic field,
   b) applying a sequence of RF excitation and/or refocusing pulses to excite/refocus frequencies for spins containing the contrast agent or the object,
   c) detecting spin signals at a plurality of different times after excitation and/or refocusing pulses, wherein the detected signals are from spins that have a positive off-resonance and spins that have a negative off-resonance, and spins that are on-resonance, wherein the spin signals from the off-resonance spins and on-resonance spins are simultaneously detected;
   d) using a mathematical transform on all detected signals to separate detected signals from spins that have a positive off-resonance from detected signals from spins that have a negative off-resonance and from detected signals from spins that are on-resonance; and
   e) identifying the presence and location in the body of the contrast agent or object using the separated detected signals from spins that have a positive off-resonance and/or signal from spins that have a negative off-resonance.

2. The method of claim 1 wherein step d) further comprising using the detected signals from spins that are on-resonance for providing an anatomical reference.

3. The method of claim 2, further comprising using the separated detected signals from spins that have a positive off-resonance and signals from spins that have a negative off-resonance and signals from spins that are on-resonance to form images from the signals from spins that are off-resonance and images from signals from spins that are on-resonance wherein the images from the signals from spins that are off-resonance are superimposed on images from signals from spins that are on-resonance.

4. The method of claim 3 wherein the superimposition is color coded to indicate a focus of high local susceptibility.

5. The method of claim 2 wherein the magnetic field surrounding the contrast agent or object has positive polar lobes and negative equatorial lobes whereby off-resonance frequency pass bands occur at frequencies higher and lower than an on-resonance frequency for spins not experiencing magnetic field variations.

6. The method of claim 5 wherein in step c) the polar lobes are twice the magnitude of the equatorial lobes.

7. The method of claim 6 wherein in step a) the static magnetic field is 1.5 Tesla, and in step c) the frequency pass bands occur at +1,600 Hz and at −800 Hz from the frequency of an echo for spins not experiencing magnetic field variations.

8. The method of claim 7 wherein at least some of the detected signals are detected from a voxel, wherein the signals from the voxel are $$s(t_n) = \rho_o + \sum_{m=1}^{M} \rho_m e^{i2\pi \Delta f_m t_n} \quad (1)$$

where $\rho_o$ is the on-resonance component, and $\rho_m$ is the $m^{th}$ off-resonance component, m=1, ..., M. $\Delta f_m$ is the off-resonance frequency of the $m^{th}$ component, and $t_n$ (n=1, ..., N) is the echo time at which $s(t_n)$ was acquired.

9. The method of claim 1 wherein at least some of the detected signals are detected from a voxel, wherein the signals from the voxel are $$s(t_n) = \rho_o + \sum_{m=1}^{M} \rho_m e^{i2\pi \Delta f_m t_n} \quad (1)$$

where $\rho_o$ is the on-resonance component, and $\rho_m$ is the $m^{th}$ off-resonance component, m=1, ..., M. $\Delta f_m$ is the off-resonance frequency of the $m^{th}$ component, and $t_n$ (n=1, ..., N) is the echo time at which $s(t_n)$ was acquired.

10. The method of claim 9 wherein step c) includes detecting signals from spins not experiencing magnetic field variations to provide an anatomical reference.

11. The method of claim 10 further comprising using the separated detected signals from spins that have a positive off-resonance and signals from spins that have a negative off-resonance and signals from spins that are on-resonance to form images from the signals from spins that are off-resonance and images from signals from spins that are on-resonance wherein the images from the signals from spins that are off-resonance are superimposed on images from signals from spins that are on-resonance.

12. The method of claim 11 wherein the superimposition is color coded to indicate a focus of high local susceptibility.

13. The method of claim 1 wherein the magnetic field surrounding the contrast agent or object has positive polar lobes and negative equatorial lobes whereby off-resonance frequency pass bands occur at times after and before an on-resonance echo time for spins not experiencing magnetic field variations.

14. The method of claim 13 wherein in step c) the polar lobes are twice the magnitude of the equatorial lobes.

15. The method of claim 1 wherein the magnetic field surrounding the contrast agent or object has positive polar lobes and negative equatorial lobes whereby off-resonance frequency pass bands occur at frequencies higher and lower than an on-resonance frequency for spins not experiencing magnetic field variations.

16. The method of claim 15 wherein in step c) the polar lobes are twice the magnitude of the equatorial lobes.

17. The method of claim 16 wherein step c) includes detecting signals from spins not experiencing magnetic field variations to provide an anatomical reference.

18. The method of claim 17, further comprising using the separated detected signals from spins that have a positive off-resonance and signals from spins that have a negative off-resonance and signals from spins that are on-resonance to form images from the signals from spins that are off-resonance and images from signals from spins that are on-resonance wherein the images from the signals from spins that are off-resonance are superimposed on images from signals from spins that are on-resonance.

19. The method of claim 18 wherein the superimposition is color coded to indicate a focus of high local susceptibility.

* * * * *